United States Patent
Baldus et al.

(10) Patent No.: US 8,417,215 B2
(45) Date of Patent: Apr. 9, 2013

(54) METHOD FOR POSITIONING OF WIRELESS MEDICAL DEVICES WITH SHORT-RANGE RADIO FREQUENCY TECHNOLOGY

(75) Inventors: Heribert Baldus, Aachen (DE); Karin Klabunde, Aachen (DE); Guido Musch, Aachen (DE); Joan Santos Farras, Terrassa (ES)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/599,147

(22) PCT Filed: Mar. 11, 2005

(86) PCT No.: PCT/IB2005/050881
§ 371 (c)(1), (2), (4) Date: Sep. 21, 2006

(87) PCT Pub. No.: WO2005/096568
PCT Pub. Date: Oct. 13, 2005

(65) Prior Publication Data
US 2007/0255111 A1    Nov. 1, 2007

Related U.S. Application Data

(60) Provisional application No. 60/558,279, filed on Mar. 31, 2004, provisional application No. 60/619,117, filed on Oct. 15, 2004.

(51) Int. Cl.
*H04M 11/04* (2006.01)

(52) U.S. Cl.
USPC .............. 455/404.2; 455/404.1; 455/414.1; 455/418; 455/456.1; 455/456.2; 455/456.5; 455/457; 455/521

(58) Field of Classification Search .................. None
See application file for complete search history.

(56) References Cited

U.S. PATENT DOCUMENTS 6,553,262 B1    4/2003    Lang et al.
2002/0167919 A1    11/2002    Marples et al.
(Continued)

FOREIGN PATENT DOCUMENTS

| EP | 1 239 634 A2 | 9/2002 |
| EP | 1 293 800 A1 | 3/2003 |
| WO | WO 2004054304 A1 | 6/2004 |

OTHER PUBLICATIONS

Bahl, P., et al.; RADAR: An in-building RF-based user location and tracking system; 2000; Proc. IEEE INFOCOM; vol. 2; pp. 775-784.
(Continued)

*Primary Examiner* — Olumide T Ajibade Akonai
*Assistant Examiner* — Randy Peaches (57) ABSTRACT

In a tracking method for tracking a local wireless device in a medical facility having a medical facility network (10), the local wireless device (50, 51, 52), which is not connected with the medical facility network (10), is detected based on local wireless communication. (54, 55, 56, 58) between the local wireless device and at least one nearby network device (12, 14, 16) that is connected with the medical facility network. A location of the local wireless device within the medical facility is estimated based on the local wireless communication and information indicative of a location of the at least one nearby network device.

15 Claims, 4 Drawing Sheets

U.S. PATENT DOCUMENTS

| | | | |
|---|---|---|---|
| 2002/0184418 A1 | 12/2002 | Blight | |
| 2003/0158635 A1* | 8/2003 | Pillar et al. | 701/1 |
| 2003/0174049 A1* | 9/2003 | Beigel et al. | 340/10.42 |
| 2003/0235172 A1 | 12/2003 | Wood | |

OTHER PUBLICATIONS

Want, R., et al.; The Active Badge Location System; 1992; ACM Transactions on Information Systems; 10(1)91-102.

Radianse website; Radianse, Inc.; Nov. 16, 2010; www.radianse.com/products.

Elpas Overview—Elpas EIRIS Local Positioning System; Visonic Technologies; 2002; www.elpas.com.

Bahl, P., et al.; RADAR: An in-building RF-based user location and tracking system; Microsoft Research.

Want, R., et al.; The active badge location system; Olivetti Research, Ltd., Cambridge, England.

Hightower, J., et al.; A survey and taxonomy of location systems for ubiquitous computing; 2001; Technical Support UW-CSE Jan. 8, 2003.

Ubisense website—Ubisense Limited, 2003; http://www.ubisense.net/products.

Ekahau website—Ekahau, Inc.; 2000-2004; http://www.ekahau.com.

Radianse website—Radianse, Inc.; http://www.radianse.com/products.

Visonic Technologies—Elpas Overview; http://www.visonictech.com.

* cited by examiner

METHOD FOR POSITIONING OF WIRELESS MEDICAL DEVICES WITH SHORT-RANGE RADIO FREQUENCY TECHNOLOGY

This application is a national stage entry of International Application Serial No. PCT/IB2005/050881, filed Mar. 11, 2005 which claims the benefit of U.S. Provisional Application Ser. No. 60/558,279, filed Mar. 31, 2004, and of U.S. Provisional Application Ser. No. 60/619,117, filed Oct. 15, 2004.

The following relates to the medical arts. It finds particular application in tracking equipment and personnel in hospitals and other medical facilities, and will be described with particular reference thereto. More generally, it finds application in tracking medical equipment, wireless medical sensor arrays, medical personnel wearing or carrying cellular telephones, personal data assistants, short-range wireless-equipped identification tags, and other wireless communication devices, and other mobile devices having short-range wireless connections in medical facility settings.

Hospitals and other medical facilities are rapidly moving toward wireless networking of medical diagnostic devices, medical treatment devices, and the like. Wireless networking enables rapid transmission of data to a nurses' station, floor monitor, or other central monitoring location, reduces the number of wires and cables in patients' rooms, and allows rapid hookup of devices to the medical facility network.

Additionally, it has been recognized that wireless networking provides convenient device tracking. For example, in the context of an IEEE 802.11 wireless hospital network infrastructure, the location of roaming network devices is already largely determined based on which wireless access point has the strongest communication link(s) with the roaming device. Existing network-infrastructure based tracking systems utilize and refine this built-in network tracking capability to track wireless devices that are compatible with the deployed wireless network infrastructure. Network tracking enables medical personnel to rapidly locate mobile wireless networked medical equipment, which saves time and manpower. In emergency medical situations the ability to rapidly locate networked medical equipment can save lives.

These existing network tracking systems are limited to tracking wireless devices of their specific wireless technology. Local wireless devices employing Bluetooth, ZigBee, or other wireless technologies that are not network-compatible are not tracked. Such local wireless technologies are commonly used for short-range communication. For example, Bluetooth enabled cellular telephones, personal data assistants (PDA's), and the like are carried by many medical personnel. The Bluetooth connectivity enables these devices to communicate with the owner's personal computer or with other devices located in the same room or nearby. Bluetooth connections are also used to wirelessly connect medical probes, wireless vital signs sensor arrays, or the like with associated monitor devices. Bluetooth, ZigBee, and other local wireless links are generally limited to about ten meters or less, and generally cannot connect with the 802.11 wireless hospital network.

The following contemplates improved apparatuses and methods that overcome the aforementioned limitations and others.

According to one aspect, a tracking method is provided for tracking a local wireless device in a medical facility having a medical facility network. The local wireless device, which is not connected with the medical facility network, is detected based on local wireless communication between the local wireless device and at least one nearby network device that is connected with the medical facility network. A location of the local wireless device within the medical facility is estimated based on the local wireless communication and information indicative of a location of the at least one nearby network device.

According to another aspect, a tracking system is disclosed for tracking a local wireless device in a medical facility having a medical facility network. A means is provided for detecting the local wireless device, which is not connected with the medical facility network, based on local wireless communication between the local wireless device and at least one nearby network device that is connected with the medical facility network. A means is provided for estimating a location of the local wireless device within the medical facility based on the local wireless communication and information indicative of a location of the at least one nearby network device.

One advantage resides in improved tracking for non-networked equipment, devices, personnel, and other items in a medical facility.

Another advantage resides in providing tracking of non-networked items in a medical facility without requiring additional communication hardware.

Yet another advantage resides in providing integrated tracking of both networked and non-networked items in a medical facility.

Numerous additional advantages and benefits will become apparent to those of ordinary skill in the art upon reading the following detailed description.

The invention may take form in various components and arrangements of components, and in various process operations and arrangements of process operations. The drawings are only for the purpose of illustrating preferred embodiments and are not to be construed as limiting the invention.

An illustrated tracking system is described with reference to FIG. 1, which shows a diagrammatic block diagram of the system, and with reference to FIG. 2, which illustrates example components of the medical facility network, example wireless network devices, and example local wireless devices. The hospital network includes a local area network 10 that wirelessly communicates with wireless network devices 12, 14, 16, 18. For example, as shown in FIG. 2, the wireless network devices may include a vital signs monitoring station 12, a intravenous (IV) injection flow controller 14, a patients' monitor at a nurses' station 16, a vital signs transducer 18 carried by an ambulating patient, and so forth. The illustrated wireless network devices 12, 14, 16, 18 are examples, and other devices can be similarly wirelessly connected with the local area network 10.

The local area network 10 typically includes a local area network server 20 and a plurality of wireless network access points 22, 24 distributed through the medical facility and connected with the local area network server 20 by wired Ethernet cables 26, 28. Alternatively, a Token Ring or another wired network connection can be employed. The network access points 22, 24 are distributed throughout the medical facility to provide substantially complete wireless network coverage for the facility, so that wireless network devices can communicate with the network 10 from substantially anywhere in the medical facility. Although not shown, in some networks wireless access extension points are provided which wirelessly communicate with one of the wired network access points 22, 24 to provide extended network area coverage.

Network devices such as the vital signs monitoring station 12, the IV flow controller 14, and the nurses' station monitor 16 wirelessly communicate with the nearest or most strongly wirelessly coupled network access points 22, 24 in order to wirelessly connect with the medical facility network 10. Additionally or alternatively, one or more software access points can be employed. For example, a computer 30 connected with the local area network server 20 by wired Ethernet cable 32 includes a software access point implemented by a wireless card (not shown) installed in the computer 30 and suitable software. Network devices such as the vital signs transducer 18 may wirelessly connect with the software access point embodied by the computer 30 in order to wirelessly connect with the medical facility network 10.

Figure 1:
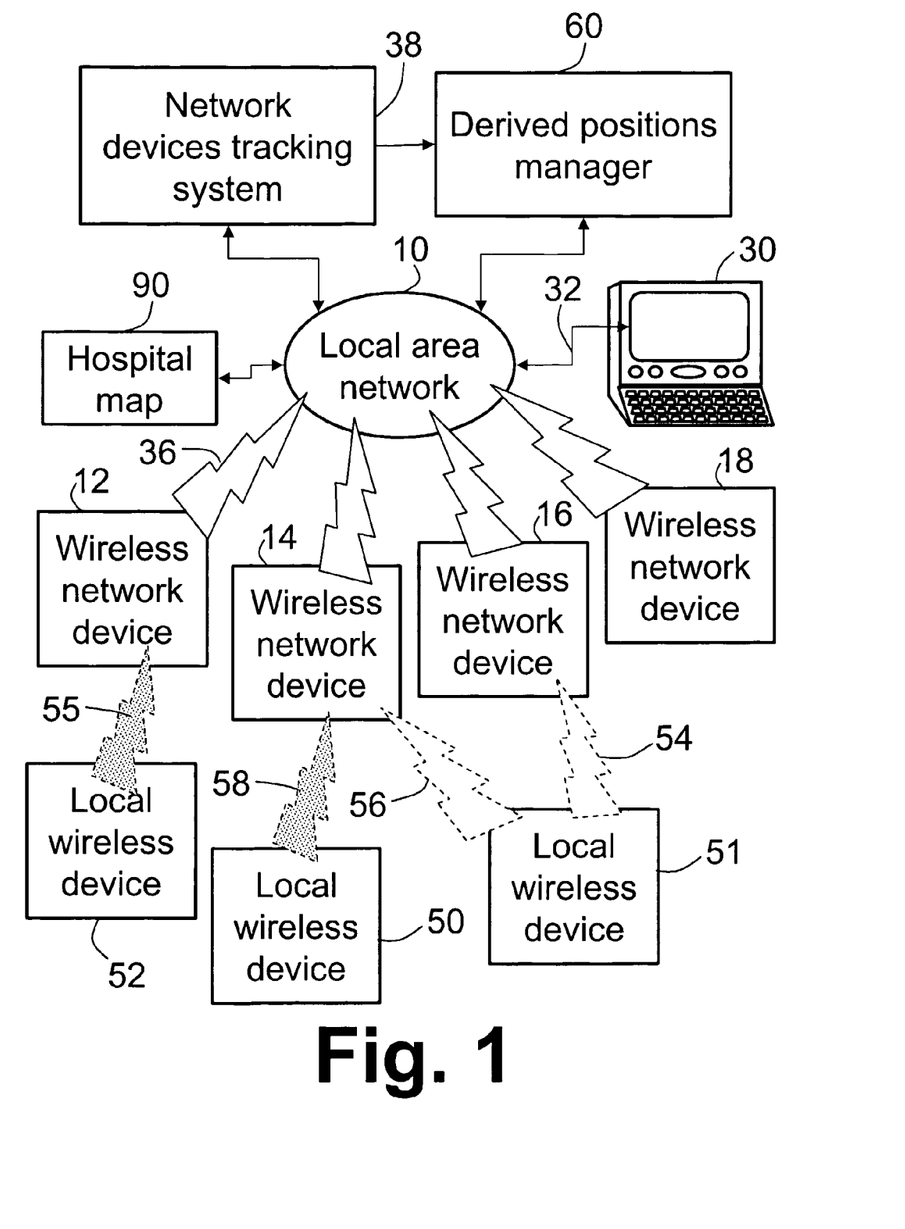
FIG. 1 diagrammatically shows a tracking system for a hospital facility capable of tracking both networked and non-networked devices.
Figure 2:
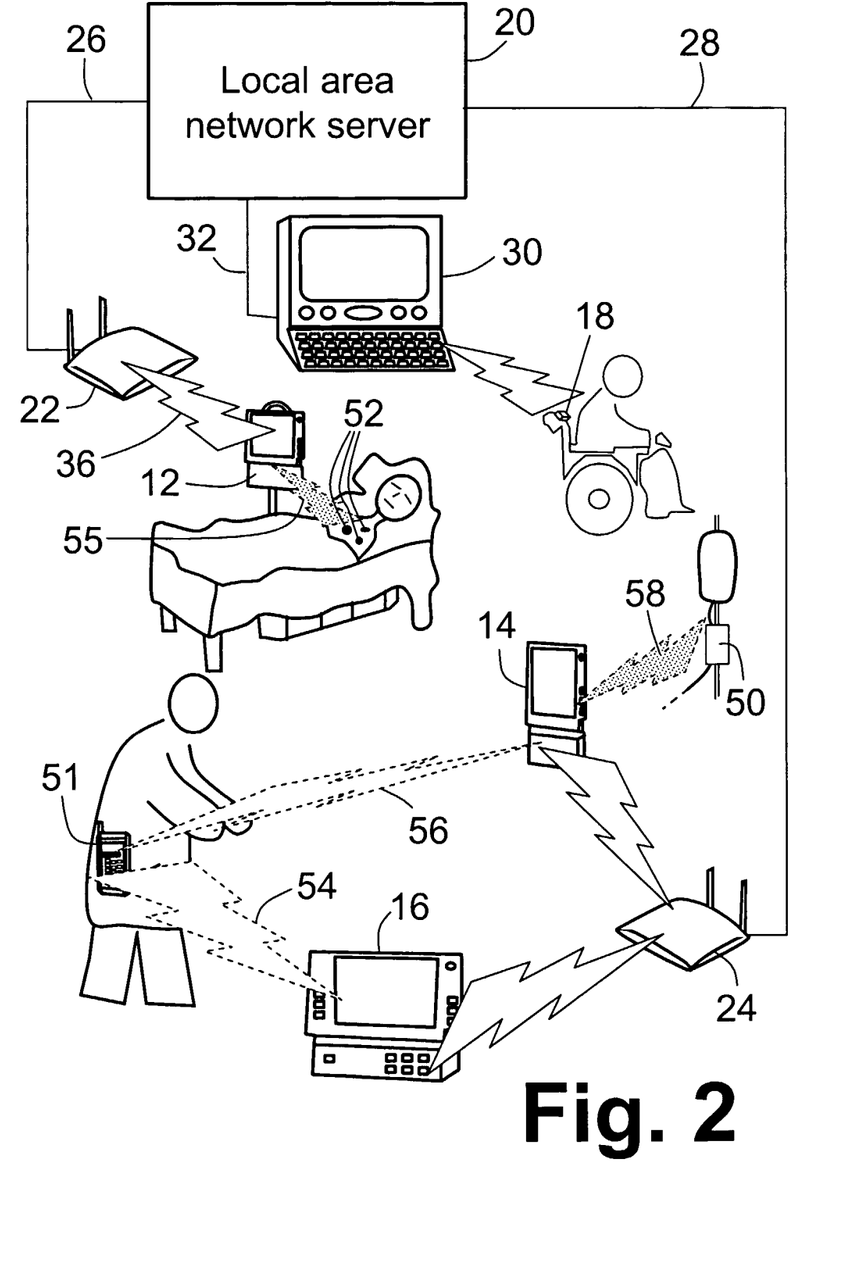
FIG. 2 diagrammatically shows connections between the hospital facility network and network devices, and local wireless communication between wireless network devices and local wireless devices not connected with the hospital facility network.

The wireless network connections are indicated in FIGS. 1 and 2 by jagged connectors drawn using solid lines, such as the example labeled connector 36 connecting the vital signs monitor station 12 with the access point 22 of the medical facility network 10. (The remaining wireless network connections are similarly indicated by solid-line jagged connectors, but are not labeled with reference numbers in FIGS. 1 and 2). In some embodiments, the wireless network communication comports with an IEEE 802.11 local area network protocol; however, other wireless local area network protocols can be employed.

Some of the wireless network devices are roaming network devices. For example, the ambulatory vital signs transducer 18 moves frequently as the ambulatory patient roams the halls of the medical facility, and the IV flow controller 14 is frequently moved from room to room. Other wireless devices are less frequently roaming or may even be substantially stationary. For example, the vital signs monitor station 12 may generally stay in the same patient's room for several days, and the nurses' station monitor 16 in some medical facilities may not move for years. Network devices which are not wireless, such as the computer 30, generally move infrequently or not at all.

A network devices tracking system 38 tracks the mobile or potentially mobile wireless network devices 12, 14, 16, 18. The network devices tracking system 38 is typically a software program or module executing on the local area network server 20; however, another computer or other digital processing hardware can embody the network devices tracking system 38.

As a roaming wireless network device moves, its distance from the locked-in access point used for network communication changes. If the roaming wireless network device moves far enough, it may be switched over to another access point which is now closer. For example, if the ambulatory patient carrying the vital signs transducer 18 moves away from the computer 30 (which embodies a software access point) and toward the access point 24, eventually its wireless network connection will switch over to the access point 24. Thus, the wireless network inherently includes the capability of performing a rough tracking of roaming network devices.

The wireless network devices tracking system 38 more precisely determines the location of each wireless network device 12, 14, 16, 18 based on factors such as signal strength, triangulation of the signals received by several access points, or so forth. The wireless network devices tracking system 38 is limited to tracking network devices 12, 14, 16, 18 which are connected with the medical facility network 10.

With continuing reference to FIGS. 1 and 2, not all wireless devices are network devices connected with the medical facility network 10. For example, local wireless devices 50, 51, 52 may include local wireless capability that is not compatible with the 802.11 wireless protocol or other wireless network protocol employed by the medical facility network 10. As illustrated in FIG. 2, the local wireless device 50 is an infusion pump controlling an intravenous flow. The infusion pump 50 is wirelessly connected with the IV flow controller 14 which controls the infusion pump 50 to set the rate of intravenous infusion. The local wireless device 51 is a cellular telephone carried by a doctor or other medical person.

In some cases, the local wireless device can be an autonomous sensor network. For example, an autonomous vital signs sensor network 52 includes wireless sensors monitoring a patient's electrocardiograph (ECG), pulse rate, blood oxygen, and so forth. The vital signs monitor station 12 receives and displays the vital signs measured by the vital signs sensor network 52; however, the vital signs sensor network 52 is autonomous and continues to monitor the vital signs of the patient even if the patient is taken outside of radio range of the monitor station 12, for example to be taken to a diagnostic imaging facility. Other examples of wireless devices that may be present in medical facility settings include wireless patient and staff identification bracelets or tags that include short-range wireless transmitters that identify the patient or staff member to local monitors.

The local wireless devices 50, 51, 52 employ a non-network wireless communication protocol such as an IEEE 802.15.1 protocol (also sometimes called Bluetooth), an IEEE 802.15.3 protocol, an 802.15.4 protocol (also sometimes called ZigBee), or the like. Bluetooth, ZigBee, and most other short-range wireless communication protocols are incompatible with the 802.11 network protocol and other wireless network protocols. (The cellular telephone 51 is a local wireless device insofar as it includes short-range wireless protocol capability such as Bluetooth or Zigbee. The cellular telephone 51 also inherently includes longer-range wireless transmission capability in order to communicate with the cellular telephone network; however, the cellular protocol generally is incompatible with the 802.11 network protocol and most other wireless network protocols, and so the cellular telephone 51 is not connected with the wireless medical facility network 10.) However, the local wireless devices 50, 51, 52 can communicate with each other when the distance between devices is within the short range of the local wireless communication capability, which is typically less than ten meters.

To locate these non-network local wireless devices 50, 51, 52, the network devices 12, 14, 16, 18, and optionally also other non-network local wireless devices, are used. In addition to being wirelessly connected with the medical facility network 10, many of these network devices include Bluetooth, ZigBee, or other non-network wireless connectivity, and various such network devices are generally present throughout the medical facility. Accordingly, each network device 12, 14, 16, 18 having the requisite non-network local wireless communication capability performs occasional scans to detect local wireless devices within range that are also capable of communicating by the non-network local wireless communication protocol. In the illustrated configuration, the vital signs monitor station 12 detects the vital signs sensor array 52. The IV flow controller 14 detects both the infusion pump 50 and the cellular telephone 51. The nurses' station monitor 16 detects only the cellular telephone 51. The vital signs transducer 18 does not detect any of the local wireless devices 50, 51, 52. Because Bluetooth, ZigBee, and other non-network local wireless communication protocols are short-range, only nearby network devices are able to detect a given local wireless device. Moreover, some network devices may not have the capability to communicate using the requisite non-network local wireless communication protocol, and thus cannot detect even nearby local wireless devices.

The non-network local wireless communications are indicated in FIGS. 1 and 2 by jagged connectors 54, 55, 56, 58 drawn using dashed lines. Wireless communication 54 is between the nurses' station monitor 16 and the cellular telephone 52. Wireless communication 55 is between the vital signs monitor station 12 and the sensors network 52. Wireless communication 56 is between the IV flow controller 14 and the cellular telephone 52. Wireless communication 58 is between the infusion pump 50 and the IV flow controller 14. These Bluetooth, ZigBee, or other local wireless communications 54, 55, 56, 58 are to be distinguished from wireless network connections following the 802.11 protocol or another wireless network protocol, such as the wireless network connection 36, which are indicated by jagged connectors drawn using solid lines. Moreover, it is to be appreciated that the illustrated local wireless communications 54, 55, 56, 58 are a snapshot in time—as devices move about, communications may be dropped as communicating devices move apart from one another, or added as devices capable of local wireless communication come together.

As illustrated in FIGS. 1 and 2, some local wireless communications 54, 56 are brief polling communications limited to detecting and identifying local wireless devices within range. These are typically not considered to be wireless connections, but rather are brief wireless polling communications. On the other hand, in some cases a network device may actually be wirelessly connected with a local wireless device for the purpose of substantive transmission of data, control commands, or the like. In FIGS. 1 and 2, two example wireless connections are: (i) the local wireless communication 58 between the infusion pump 50 and the IV flow controller 14; and (ii) the local wireless communication 55 between the autonomous vital signs sensors network 52 and the vital signs monitor station 12. The substantive and prolonged nature of these local wireless connections 55, 58 are indicated by filling the corresponding jagged connectors with a dotted pattern in FIGS. 1 and 2.

When nearby network devices 12, 14, 16 detect local wireless devices 50, 51, 52, they communicate information about the detected local wireless devices to a derived positions manager 60. Typically, the communicated information includes an identification of the local wireless devices 50, 51, 52, which may for example be a media access control (MAC) address for each detected local wireless device. Optionally, an indication of the signal strength of the local wireless communication 54, 55, 56, 58 is also communicated. Based on the local wireless communication 54, 55, 56, 58 and information indicative of the location of the detecting nearby network devices 14, 16, the location of the detected local wireless devices 50, 51, 52 can be estimated. Optionally, local wireless communication between two or more of the local wireless devices 50, 51, 52 (not illustrated) can also be used to aid in the locating.

Location information for roaming wireless network devices is suitably obtained from the network devices tracking system 38. In a medical facility employing a mostly wireless network infrastructure, the tracked wireless network devices may be sufficient to perform locating of the local wireless devices. On the other hand, if there are a significant number of wired network devices that are generally stationary, the location of these stationary network devices is optionally also retrieved from a data file into which location information for stationary network devices has been previously entered. In this case, those stationary network devices which include Bluetooth, ZigBee, or another local wireless communication capability can also be used for detecting and localizing local wireless devices. The derived positions manager 60 estimates the location of detected local wireless devices 50, 51, 52 based on the locations of the nearby detecting network devices 12, 14, 16 using any suitable locating method. Other a priori knowledge, such as room layouts, last known position and device portability, nature of the device (i.e., sensors 52 that remain associated with the same patient), and the like can also be used by the derived positions manager 60 in locating the local wireless devices.

Figure 3:
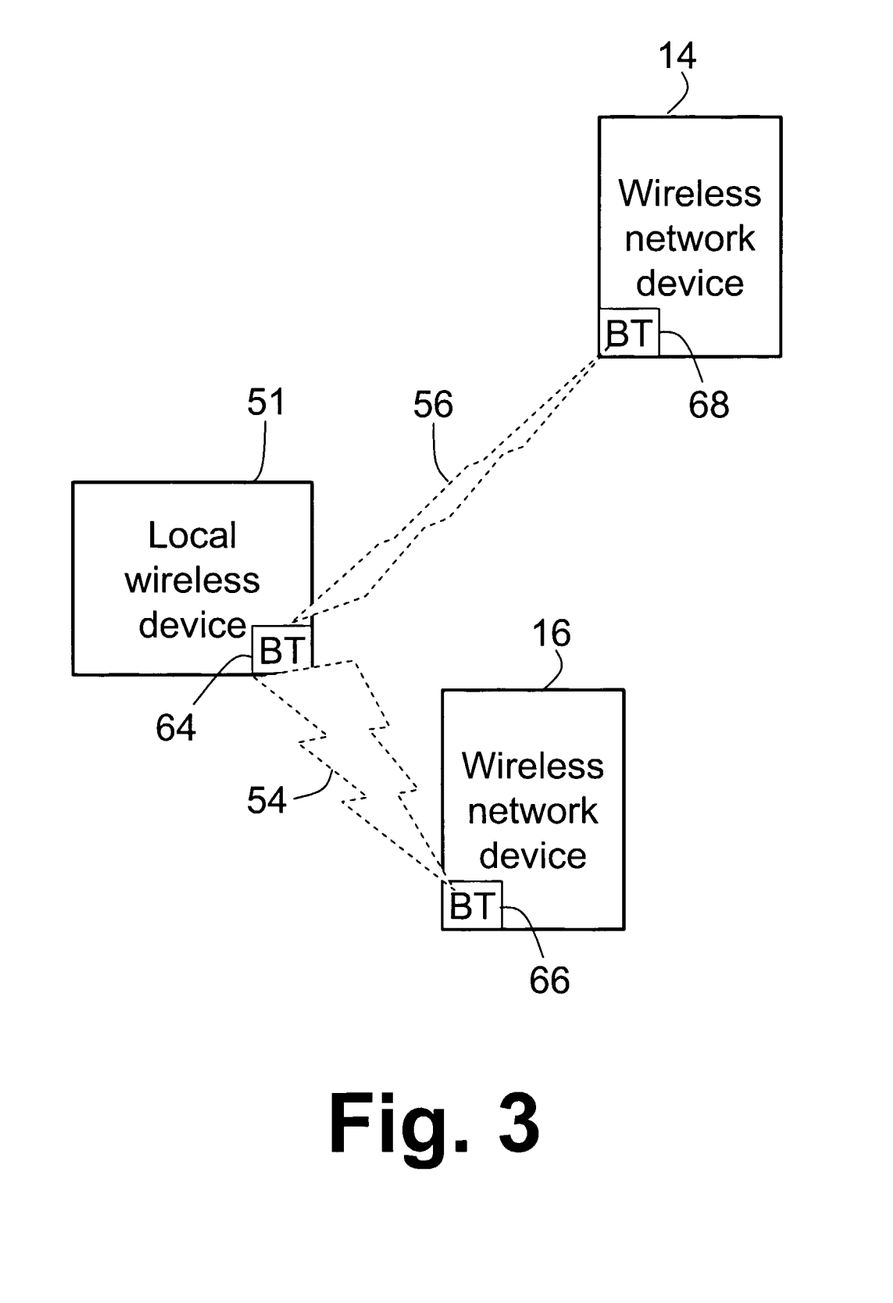
FIG. 3 diagrammatically illustrates estimating the location of a local wireless device not connected with the network based on signal strength of the local wireless communication.

With reference to FIG. 3, one suitable method for estimating the location of a local wireless device based on local wireless communication is described. Specifically, the location of the cellular telephone 52 is estimated based on the local wireless communications 54, 56. The local wireless communication 54 between the cellular telephone 52 and the nurses' station monitor 16 is achieved using: (i) local wireless communication hardware 64 installed in or integrated with the cellular telephone 52 employing a selected non-network local wireless communication protocol such as Bluetooth or ZigBee; and (ii) local non-network wireless communication hardware 66 installed in or integrated with the nurses' station monitor 16 employing the same selected non-network local wireless communication protocol. Similarly, the local wireless communication 56 between the cellular telephone 52 and the IV flow controller 14 is achieved using: (i) the local wireless communication hardware 64 of the cellular telephone 52; and (ii) local non-network wireless communication hardware 68 installed in or integrated with the IV flow controller 14 employing the same selected non-network local wireless communication protocol. In FIG. 3, all three local non-network wireless communication hardware components 64, 66, 68 are Bluetooth cards installed in the respective devices 52, 16, 14.

In some embodiments, the derived positions manager 60 estimates the location of the local wireless cellular telephone 52 based on the signal strengths of the local wireless communications 54, 56. In the example illustrated in FIG. 3, the signal strength of the local wireless communications 54 is substantially stronger than the signal strength of the local wireless communications 56, as indicated diagrammatically by a thicker jagged connector representation of the wireless communication 54. This stronger signal for the wireless communication 54 indicates that the distance between the cellular telephone 52 and the nurses' station monitor 16 is smaller than the distance between the cellular telephone 52 and the IV flow controller 14. Accordingly, the cellular telephone 52 can be estimated to be relatively closer to the nurses' station monitor 16 and relatively further away from the IV flow controller 14. In some embodiments, a more quantitative distance estimate is made, for example based on the assumption that the signal strength for an omni-directional wireless communication decreases proportional to the square of the distance from the signal source.

If the signal strength is not measured or is not communicated to the derived positions manager 60, the distance between the local wireless device and a nearby detecting network device can be estimated as less than or about the maximum communication distance of the local wireless communication. This approach is simple and can be relatively accurate when the range of the local wireless communication is short. For example, Bluetooth and ZigBee devices typically have a communication range of about ten meters, enabling localization to within about ten meters by this method. If only a single network device detects the local wireless device, then it may be sufficient to estimate the location of the local wireless device as substantially coinciding with the location of the detecting network device, which will be accurate to within about ten meters for typical Bluetooth and ZigBee communication ranges.

If a local wireless device is detected by more than one network device (such as the cellular telephone 52 being detected by two network devices 14, 16) then the combination can be analyzed to more closely estimate the location of the local wireless device. For example, a triangulation method can be employed, in which a circle or sphere around each network device is estimated having a radius corresponding to the determined distance between the network device and the local wireless device, and the intersection of the circles or spheres is the estimated location of the local wireless device.

In yet another approach by which the derived positions manager 60 can estimate the location of a detected local wireless device, if there is a substantive local wireless connection between the local wireless device and a network device, such as the illustrated local wireless connections 55, 58, then it is typically reasonable to assume that the local wireless device is in the same room as the connected network device. For example, it is highly likely that the vital signs sensor network 52 is in the same room as the vital signs monitor station 12 when the sensor network 52 is wirelessly connected with the monitor station 12 to perform vital signs monitoring of a patient.

Figure 4:
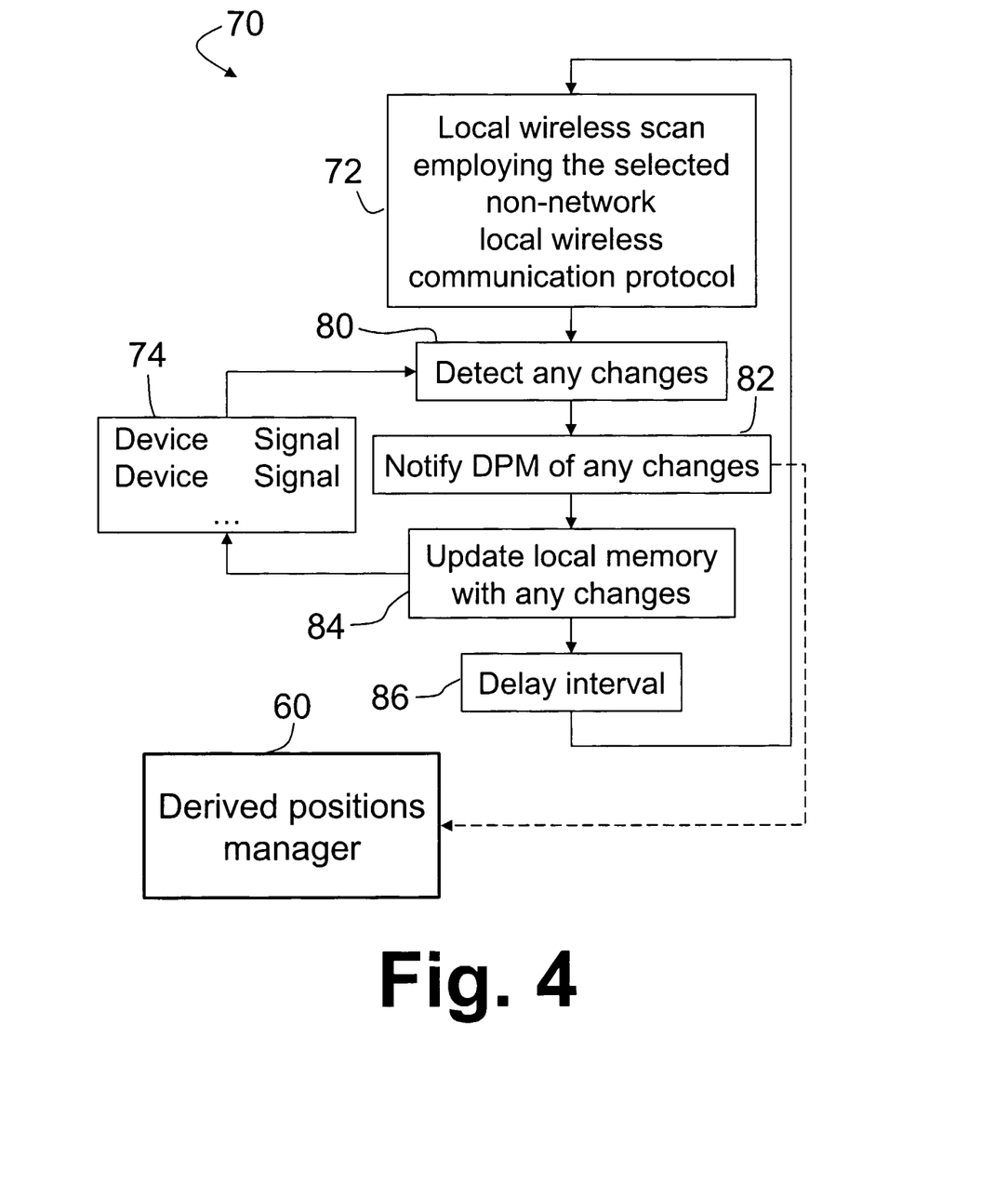
FIG. 4 shows a block diagram of a client program for detecting local wireless devices that is installed on each network device capable of local non-network wireless communication.

With reference to FIG. 4, in one suitable embodiment a client program 70 is installed on each of the network devices 12, 14, 16, 18 that includes the capability to communicate using the Bluetooth, ZigBee, or other local wireless communication protocol. The client program 70 performs operations that scan for local wireless devices and communicate detection of such devices to the derived positions manager 60. In an operation 72, the client program 70 causes the network device to employ the Bluetooth, ZigBee, or other selected non-network local wireless communication protocol to scan for other devices having the requisite Bluetooth, ZigBee, or other local wireless communication capability. The detection results are compared with previous detection results stored in a local memory 74 on the network device in a comparison process operation 80. In the illustrated example, the local memory 74 stores a device identification, such as a MAC address, and the signal strength of the local wireless communication for each detected local wireless device. The comparison process operation 80 detects addition of a new local wireless device (possibly indicating that a roaming local wireless device has moved into range), disappearance of a previously detected local wireless device (possibly indicating that the roaming local wireless device has moved out of range), or a change in the signal strength of the local wireless communication (possibly indicating movement of the local wireless device). If a change is detected, the derived positions manager 60 is notified of the change in operation 82, and the local memory 74 is updated in operation 84. After a delay 86, the process operations 72, 80, 82, 84 are repeated. In this way, any change in the detection status of any local wireless device within the range of the network device is timely reported via wireless connection to the derived positions manager 60; however, when nothing has changed, no wireless network communication traffic is generated.

The use of the client program 70 installed on each of the network devices 12, 14, 16, 18 advantageously reduces wireless network traffic and can speed up the local wireless polling operation 72. However, in some other contemplated embodiments the derived positions manager performs centralized polling by individually commanding each network device to perform polling and report results to the derived positions manager. The derived positions manager performs the change detection based on the data received from the network device. These embodiments do not require installing remote client software on the network devices.

With returning reference to FIG. 1, the location information can be provided to the user in any suitable manner. In some embodiments, a digital hospital map 90 is accessed via the local area network 10 and displayed on the computer 30 or on another display device. The location of each detected local wireless device estimated by the derived positions manager 60 is suitably superimposed on the displayed hospital map. Instead of or in addition to such a graphical representation, the information can be listed; for example, each local wireless device can be listed along with the room in which that device is disposed. Moreover, optionally the locations of wireless network devices determined by the network devices tracking system 38 is integrated with the locations of the local wireless devices to generate an integrated database of device locations that can be mapped or otherwise displayed.

Relating a location to the digital hospital map 90 can also be used to determine which room of the medical facility contains the location. This type of analysis can be used by the derived positions manager 60 to determine which room contains the nearby network devices detecting a particular local wireless device. If all the detecting nearby network devices are in the same room, the local wireless device is suitably estimated to also be located in that room. Similarly, where a local wireless device has an established local wireless connection with a network device, the room containing the connected network device is also generally a good estimate of the location of the wirelessly connected local wireless device.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A tracking method for tracking a mobile local wireless device in a medical facility having a medical facility network, the tracking method comprising:

detecting the mobile local wireless device, which is not connected with the medical facility network, based on local wireless communication between the mobile local wireless device and at least one nearby mobile wireless network device that is wirelessly connected with the medical facility network;

determining locations of a plurality of mobile wireless network devices that are wirelessly connected with the medical facility network based on wireless network connections between the mobile wireless network devices and the medical facility network, the plurality of mobile wireless network devices including the at least one nearby mobile wireless network device;

estimating a location of the mobile local wireless device within the medical facility based on the local wireless communication and the determined location of the at least one nearby mobile wireless network device;

repeating the detecting;

during a subsequent detecting, identifying a change in the local wireless communication between the mobile local wireless device and the at least one nearby mobile wireless network device, the change including at least one of (i) loss of local wireless communication between the mobile local wireless device and at least one nearby mobile wireless network device during the subsequent detecting and (ii) pickup of a new local wireless communication between the mobile local wireless device and a mobile wireless network device other than the at least one nearby mobile wireless network device of the initial detecting; and updating the location of the mobile local wireless device within the medical facility based on the change.

2. The tracking method as set forth in claim 1, wherein the wireless network connection comports with an IEEE 802.11 based wireless protocol.

3. The tracking method as set forth in claim 1, wherein the local wireless communication between the mobile local wireless device and the at least one nearby mobile wireless network device employs at least one of: (i) an IEEE 802.15.1 wireless protocol; and (ii) an 802.15.4 wireless protocol.

4. The tracking method as set forth in claim 1, wherein, prior to the detecting, the mobile local wireless device and the nearby mobile wireless network device establish a local wireless communication connection there between, and the estimating includes:

estimating the location of the mobile local wireless device as substantially coinciding with the location of the nearby mobile wireless network device.

5. The tracking method as set forth in claim 1, wherein the estimating includes:

estimating a distance between the mobile local wireless device and the at least one nearby mobile wireless network device based on a strength of a wireless signal employed in the local wireless communication.

6. The tracking method as set forth in claim 1, wherein the at least one nearby mobile wireless network device includes a plurality of nearby mobile wireless network devices that detect the mobile local wireless device, and the estimating includes:

estimating a distance between the mobile local wireless device and each nearby mobile wireless network device based on the local wireless communication; and estimating a location of the mobile local wireless device based on the estimated distances and the locations of the nearby mobile wireless network devices.

7. The tracking method as set forth in claim 1, wherein the estimating includes:

estimating a distance between the mobile local wireless device and the at least one nearby mobile wireless network device based on a maximum communication distance of the local wireless communication.

8. The tracking method as set forth in claim 1, wherein the estimating includes:

estimating the location of the mobile local wireless device as being within a room of the medical facility containing the nearby mobile wireless network device.

9. The tracking method of claim 1, further comprising:

superimposing the estimated location of the mobile local wireless device on a map of at least a portion of the medical facility to provide a visual indication of the estimated location.

10. The tracking method as set forth in claim 1 further comprising:

repeating the detecting and estimating for a plurality of mobile local wireless devices not connected with the medical facility network to estimate a location for each mobile local wireless device; and combining the estimated locations of the plurality of mobile local wireless devices and the information indicative of the locations of the plurality of mobile wireless network devices to generate an integrated database of device locations.

11. A tracking system for tracking a mobile local wireless device in a medical facility having a medical facility network, the tracking system comprising:

local non-network wireless communication hardware components installed on the local wireless device and on a plurality of mobile wireless network devices that are wirelessly connected with the medical facility network, the local non-network wireless communication hardware components being configured for detecting the mobile local wireless device, which is not connected with the medical facility network, based on local wireless communication between the mobile local wireless device and the at least one nearby mobile wireless network device of the plurality of mobile wireless network devices that are wirelessly connected with the medical facility network; and a computer configured to track locations of the mobile wireless network devices based on wireless network connections between the mobile wireless network devices and the medical facility network and to estimate a location of the mobile local wireless device within the medical facility based on the local wireless communication and the location of the at least one nearby mobile wireless network device, the computer being configured to update the estimated location of the mobile wireless device responsive to at least one of (i) loss of local wireless communication between the mobile local wireless device and at least one nearby mobile wireless network device of the plurality of mobile wireless network devices and (ii) initiation of local wireless communication between the mobile local wireless device and at least one mobile wireless network device of the plurality of mobile wireless network devices.

12. The tracking system as set forth in claim 11, wherein the local non-network wireless communication hardware components include:

local wireless communication hardware installed in or integrated with the mobile local wireless device and employing a selected non-network local wireless communication protocol; and local non-network wireless communication hardware installed in or integrated with the at least one nearby mobile wireless network device and employing the selected non-network local wireless communication protocol.

13. The tracking system as set forth in claim 12, wherein the selected non-network local communication protocol is one of: (i) an 802.15.1 protocol, and (ii) an 802.15.4 protocol.

14. The tracking system as set forth in claim 12, wherein client software installed on the at least one nearby mobile wireless network device causes the at least one nearby mobile wireless network device to scan for other devices in range that are capable communicating using the selected non-network local communication protocol.

15. The tracking system as set forth in claim 11, further including:
   a graphical display configured to display a digital map of the medical facility with the estimated location of the mobile local wireless device superimposed thereon.

\* \* \* \* \*